(12) United States Patent
Kane

(10) Patent No.: US 6,251,337 B1
(45) Date of Patent: Jun. 26, 2001

(54) APPARATUS AND METHOD FOR TREATING A PARTICULATE MATERIAL WITHIN A ROTATING RETORT

(75) Inventor: John E. Kane, Houston, TX (US)

(73) Assignee: Acton Materials, Inc., Houston, TX (US)

( * ) Notice: Subject to any disclaimer, the term of this patent is extended or adjusted under 35 U.S.C. 154(b) by 0 days.

(21) Appl. No.: 09/394,161

(22) Filed: Sep. 13, 1999

(51) Int. Cl.$^7$ ..................................................... C21B 7/22
(52) U.S. Cl. ........................ 266/144; 266/173; 266/252
(58) Field of Search ................................... 266/144, 173, 266/252; 432/112; 148/630

(56) References Cited

U.S. PATENT DOCUMENTS

| | | |
|---|---|---|
| 4,025,297 * | 5/1977 | Smith et al. ........................ 432/112 |
| 5,303,904 | 4/1994 | Kemp . |
| 5,316,594 | 5/1994 | Kemp . |
| 5,407,498 | 4/1995 | Kemp . |
| 5,759,483 | 6/1998 | Kemp . |
| 5,766,544 | 6/1998 | Kemp . |

* cited by examiner

Primary Examiner—Scott Kastler
(74) Attorney, Agent, or Firm—Browning Bushman P.C.

(57) ABSTRACT

An apparatus and process for treating particulate material within a rotating retort in which gas is injected within the retort to fluidize the particulate material within the rotating retort. An auger is mounted within an axle supporting the retort for rotation and particulate material is injected by the auger within the retort. Gas may be exhausted from the retort through an annular chamber about the auger or from a hollow shaft of the auger. Gas may also be exhausted through a permeable wall of the retort.

18 Claims, 10 Drawing Sheets

FIG.2A
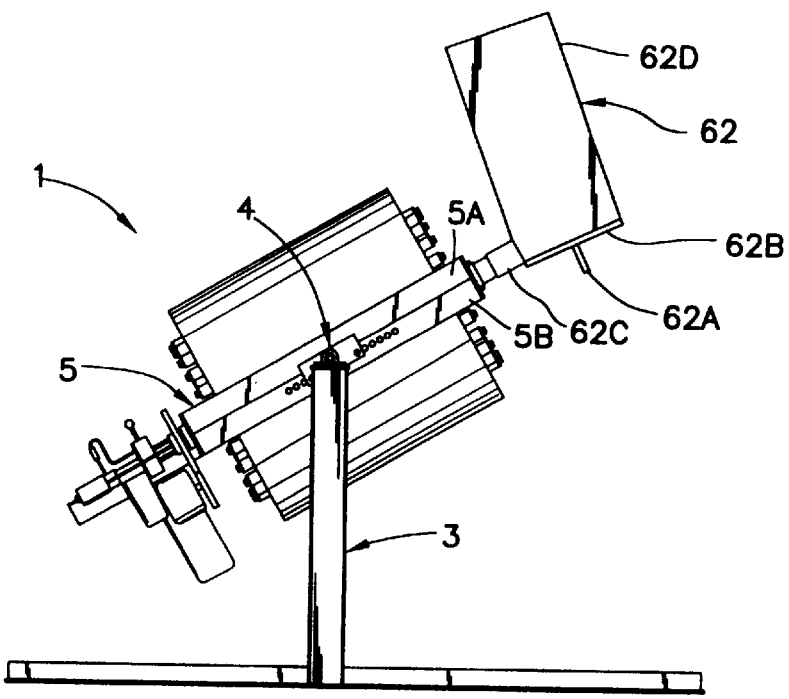
FIG.2B
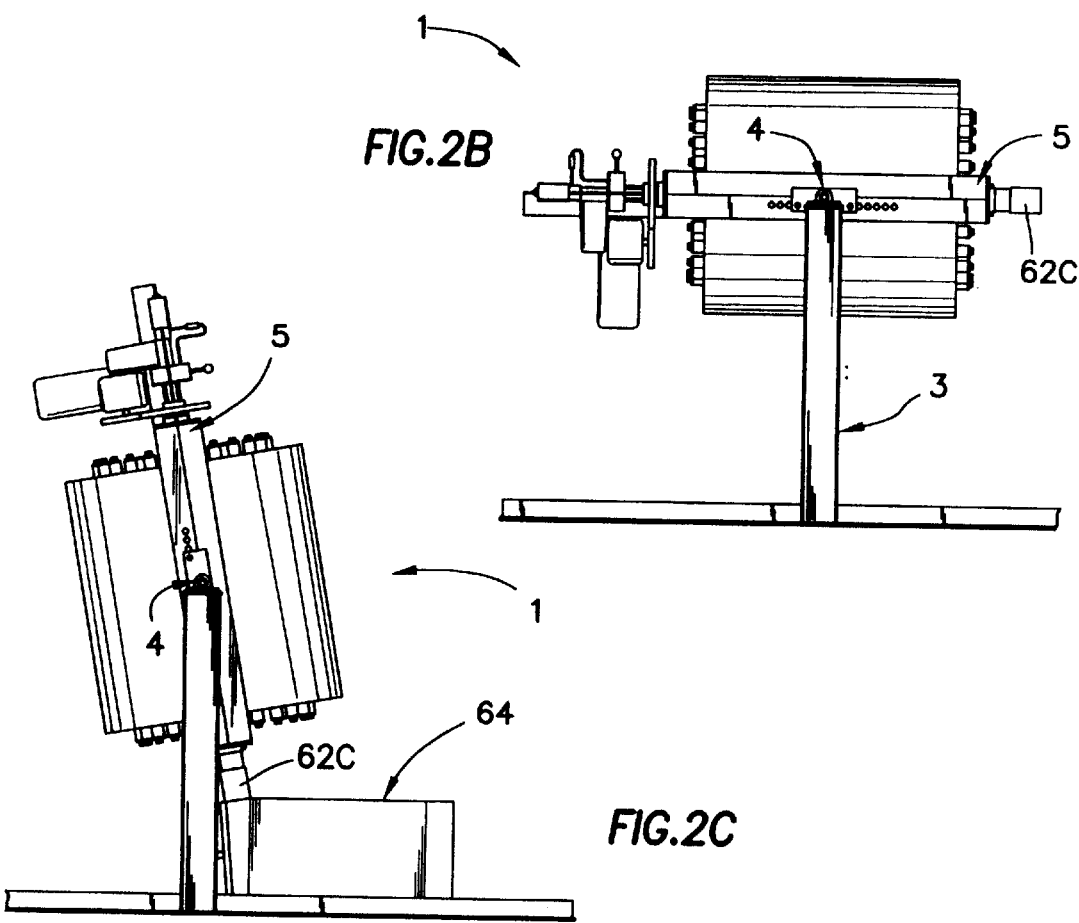
FIG.2C

FIG.3

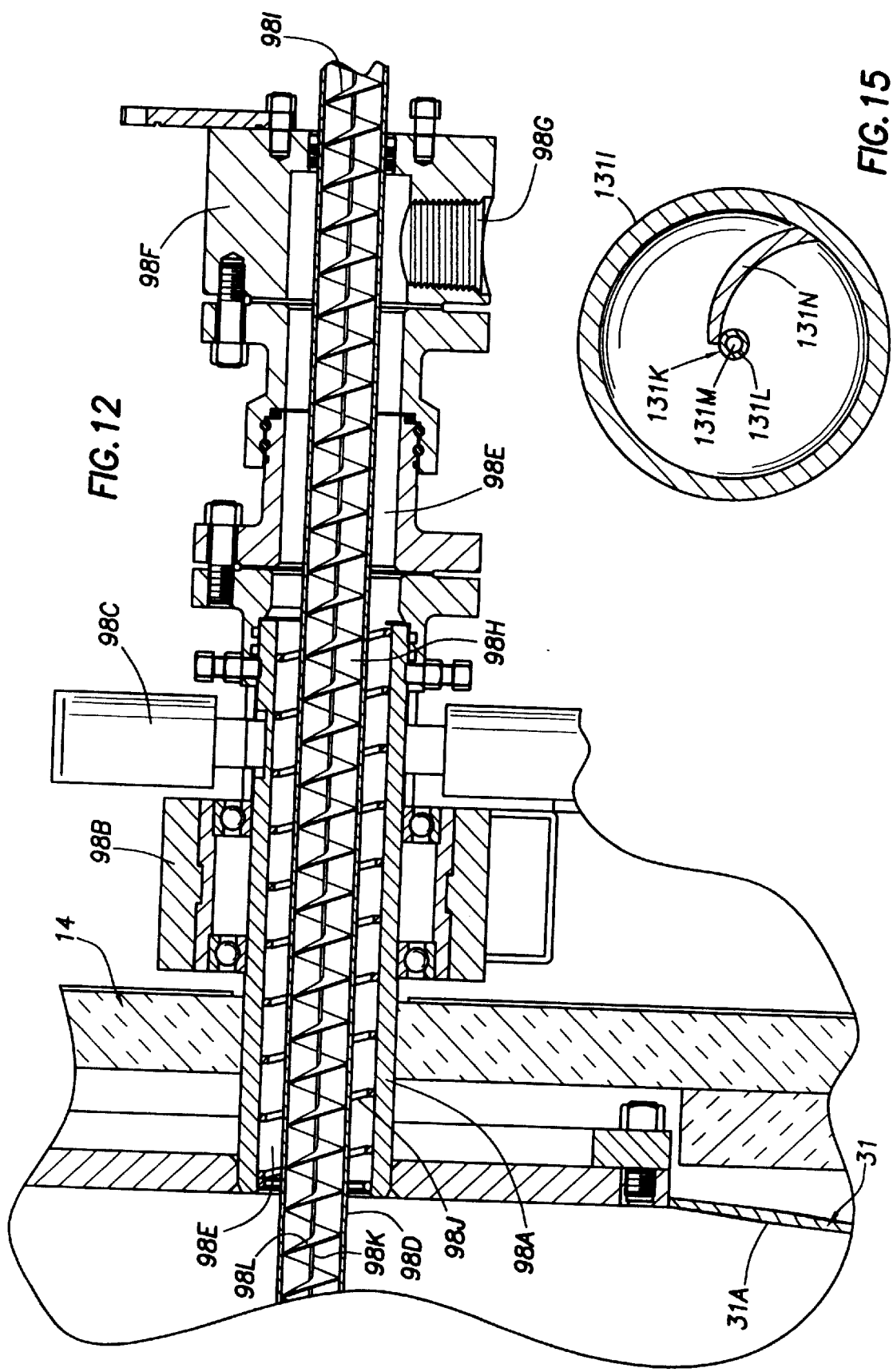

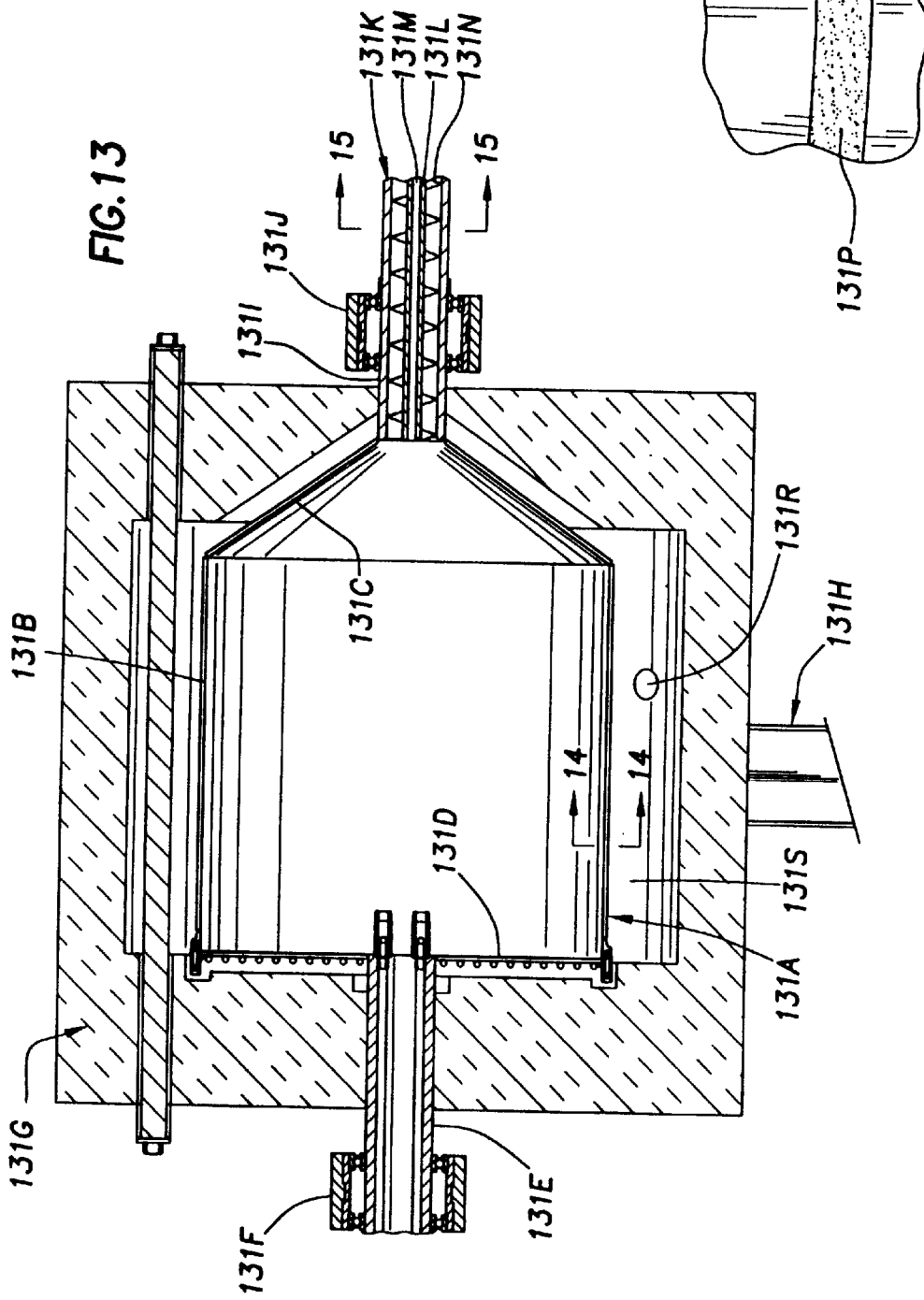
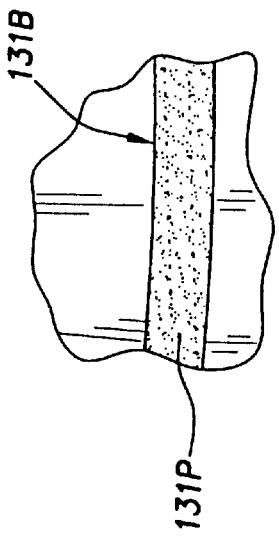
FIG. 13
FIG. 14

APPARATUS AND METHOD FOR TREATING A PARTICULATE MATERIAL WITHIN A ROTATING RETORT

FIELD OF THE INVENTION

This invention relates to an apparatus and process for treating particulate materials or powders within a rotating retort, and more particularly to such an apparatus and process in which gas is supplied to the retort to fluidize the particulate material within the rotating retort.

BACKGROUND OF THE INVENTION

U.S. Pat. No. 5,407,498 dated Apr. 18, 1995 is directed to an apparatus having a retort mounted for rotation about a horizontal axis and containing a particulate material therein which is fluidized while the retort is rotated. The retort is mounted in a cantilevered relation from an axle secured to one end of the generally cylindrical retort. Gas conduits extend through the end axle and gas may enter the retort and be exhausted from the retort through the gas conduit. Filters on the ends of the conduits prevent the flow of solid particles or particulate material into or out of the retort. Thus, particulate material cannot be loaded into the retort or unloaded from the retort while the retort is being rotated. Further, even when the retort is not being rotated, an end cap is required to be removed in order to provide access to a port for loading or unloading the particulate material. Also, the filters shown on the inner ends of the gas conduits within the retort are easily clogged with particulate material embedded within the filters.

It is desirable to have a retort which may be easily loaded with particulate material and unloaded in a minimum of time and without any loss of the particulate material by leakage or the like. It is particularly desirable to have such a loading and unloading means which may be utilized during operation of the retort while the retort is rotated.

As set forth in U.S. Pat. No. 5,407,498 metallurgical operations rely on the movement of certain elements within the solid matrix of the metal to be treated. Metallurgical operations rely on chemical reaction between elements which may be physically brought together or may be induced to come together by diffusion. An element is any chemical element or substance listed in the periodic table. Elements move within the solid metal by a process of diffusion. Diffusion is encouraged when an element is attracted to another element with which it is more reactive within the same contiguous metal structure. Diffusion also occurs when metals tend to form a more homogenous solid solution. Diffusion of an element from one metal to another or between a gaseous atmosphere and a metal also takes place when the materials are in intimate contact. The employment of precise pressures is often desirable to assist in this transfer.

As an example, fine metal particles or powders of nickel and aluminum can be intermixed and brought to a temperature well below the melting point of either metal and they will react to form a nickel aluminide intermetallic compound. The combining of nickel and aluminum powders produces substantial amounts of heat. This heat can raise the temperature of operation, which further speeds the combination and eventually an uncontrolled or runaway operation can happen. Temperatures can be produced which are sufficient to melt the powders so that they agglomerate together in an undesirable mass.

Water atomized iron particles or powders which contain excess carbon and oxygen can be reduced by a combination of diffusion within the powder and chemical reactions at the surface. The oxygen is primarily an oxide on the surface of the powder but the carbon is diffused throughout. By bringing the powders into intimate contact in the pressure of hydrogen, a reaction is generated at the surface whereby carbon and oxygen combine to form a carbon oxygen gaseous compound and hydrogen and oxygen combine to form gaseous water. Carbon within the powder migrates by diffusion to the surface and reacts with the oxygen. Heat must be added to initiate the reactions and good thermal transfer helps maintain constant temperatures which are important for a controlled reaction. In some cases, the reaction changes from endothermic to exothermic as the carbon is dissipated and hydrogen begins to combine directly with the remaining oxygen.

Ideally, the elements in the fluidizing process to undergo a reaction will be brought into intimate contact with each other and will be held in contact for sufficient time for the chemical reaction to take place. Further, it is important that if heat is to be added during the reaction, it must be added with great uniformity so that the reaction takes place at the desired temperature. In the case of those reactions which generate heat it is even more important to have good thermal transfer so the heat can be removed from the operation to avoid an undesired rise in temperature.

The process or method as shown in U.S. Pat. No. 5,407,498 is not concerned with maintaining the exothermic or endothermic reactions of the particulate material at a precise uniform temperature during fluidizing within a rotating retort by (1) precisely controlling the addition of heat to the retort or the release of heat from the retort to match the heat loss or gain to or from the retort resulting from chemical reactions within the retort, and (2) precisely adding or injecting another material into the rotatable retort during fluidizing of the initial particulate material in the retort so that heat generated or lost matches the heat induced to or exiting from the retort as a result of said injection of particulate material.

SUMMARY OF THE INVENTION

The apparatus of the present invention is directed to apparatus for treating two types of workpieces. Workpieces may be particulate material such as metal powders. Workpieces may also be solid parts, which are placed amongst particulate materials.

The term "workpiece" as used in this specification and claims is interpreted as a powder or a solid part which is the subject of the treatment. The term "powder 0 or "particulate material" as used in the specification and claims is interpreted as small particles of material having a size less than 1000 microns. The term "solid parts" as used in the specification and claims refers to materials of a specific fixed shape having at least one dimension greater than around 1000 microns.

Workpieces can be either solid parts or powders. When the workpiece is a solid part, the powder which is selected for the workpiece to be placed amongst can be either inert to the process (where its functions comprise heat transfer, scrubbing or intermixing) or reactive to the process (where its functions comprise contributing, extracting or exchanging elements or compounds to, from or with the workpieces).

In this manner, a mechanically fluidized retort can simultaneously and independently control temperature, pressure, atmosphere, reactant and mixing conditions to facilitate controlled decomposition or reaction of chemicals for the purpose of depositing elements or compounds from a precursor material onto a workpiece. Precursor materials can include elements (such as but not limited to nickel, aluminum, cobalt, carbon, chromium, copper, silver, molybdenum, neodymium, yttrium, tungsten, platinum, hafnium and zirconium) or compounds of those elements in the categories of halides, carbonyls, oxides, alkyls, acetylacetonates or acetates. Deposited elements or compounds can take the structure of continuous or non-continuous films on the surface of the workpiece, or can be diffused into the workpiece.

A further object of the present invention is to produce coatings on workpieces in a more controllable manner.

When the workpiece is powder, the powder still fulfills the functions of heat transfer, mixing and scrubbing but is also the object of treatment.

Treatments are carried out in a retort, mounted for rotation about a generally horizontal axis. The retort may be heated or cooled by gases transported to the interior of the retort through a fluid passage and an axle on which the retort is mounted for rotation about a longitudinal axis. The retort is preferably supported on a tilt frame to permit the retort to tilt in a vertical plane about a horizontal axis so that particulate material in the retort may flow by gravity into and out of a desired end of the retort upon tilting of the retort to a predetermined tilt angle.

The enclosed retort is sealed from atmosphere and may be mounted on a pair of aligned end axles for rotation. Flow lines or flow passages into and out of the retort may be provided through the axles. In some instances, the retort may be cantilevered and mounted on a single end axle for rotation. Gases and particulate material may be injected into the retort and exhausted from the retort as desired while the retort is rotating. Flow conduits including filters may be provided in one end axle to inject gases into the retort and exhaust gases form the retort. The flow of the gases through the conduits may be reversed and this is effective for minimizing any clogging of the filters. Particulate material or powder may be injected through a conduit or tube in the other aligned end axle. An auger may be positioned in the conduit to feed particulate material into the retort. An annulus may be provided about the tube for the exhaust of gases if desired. An auger normally has a central shaft and a helical flange or vane is mounted about the central shaft. In some instances, the central shaft for the auger may be hollow and gases may be exhausted through the hollow central shaft.

The rotating retort normally includes a cylindrical body with end walls closing the ends of the cylindrical body. The cylindrical body may be formed of a permeable or porous body for the exhaust of gases from the retort. In some instances, it may be desirable to reverse the rotation of the auger for the removal of particulate material. The retort may be tilted to direct particulate material by gravity into the auger when having a hollow shaft with the rotation reversed. In some instances, it may be desirable to have both end walls or one end wall of the rotating retort gas permeable.

A mechanically fluidized retort provides the heat transfer, intimacy and residency with little gas flow because the fluidization does not require the passage of gas through the material. Fluidization is mechanical so the gas may stay in residence within the fluidized mass long enough for the desired reactions to take place. The fluidization action results in near constant movement of particles relative to each other so they do not stick together even at relatively high temperatures. Nevertheless, the heat transfer rate in a mechanically fluidized device is sufficient to control the temperature of the reaction by adding or removing heat as necessary. The injection of material into the retort, particularly particulate material, during rotation of the retort and fluidizing of particulate material within the retort, is at a predetermined controlled rate to control the rate of reaction between the particulate material within the retort and the material being added to the retort. An important part of the mechanical fluidizing system is the relatively long residence time of gas and powder. Although gas and powder are completely intermixed, the gas stays in the retort for a relatively long time compared to gas fluidizing systems, assuring complete reactions without resorting to re-circulation systems.

An object of the present invention is to provide a rotating retort for particulate material with the retort including a permeable wall for exhausting gas from the rotating retort or for introducing gas to the rotating retort.

A further object of the present invention is to provide such a rotating retort in which an end axle of the retort includes an auger for feeding particulate material within the retort.

Other features, advantages, and objects of the invention will be apparent from the following specification and drawings.

BRIEF DESCRIPTION OF THE DRAWINGS

FIG. 2A shows the apparatus in position to receive powder from an adjacent removable container connected to an end axle.

FIG. 2B shows the apparatus of FIG. 1 in normal operating position.

FIG. 2C shows the apparatus in a position to discharge powder into a receiving container detachably connected to an end axle.

FIG. 3 is an orthographic section at a vertical plane through the rotating axis of the apparatus.

FIG. 12 is an enlarged sectional view of an end portion of a modified retort in which material is fed within the retort through a central feed tube and gas is exhausted out of the retort through an annulus about the tube.

FIG. 13 is a sectional view of a further modification of a retort having a permeable cylindrical wall.

FIG. 14 is an enlarged sectional view taken generally along line 14—14 of FIG. 13.

FIG. 15 is an enlarged sectional view taken generally along line 15—15 of FIG. 13.

DESCRIPTION OF THE INVENTION

Figure 1:
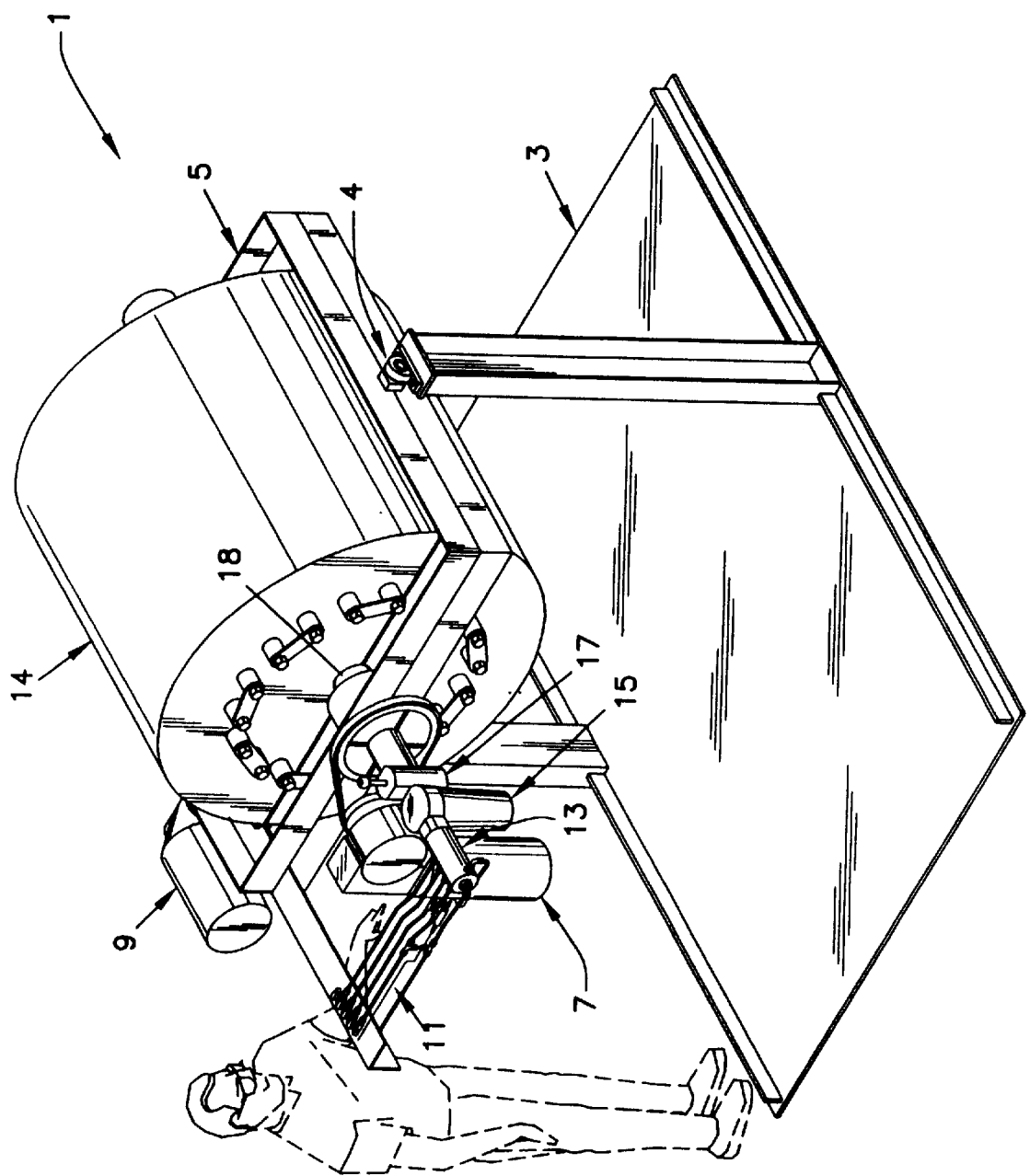
FIG. 1 is an isometric exterior view of the apparatus comprising the present invention and showing a retort mounted for rotation and for tilting.

FIG. 1 shows an exterior view of the machine assembly generally indicated as 1. Support frame 3 rests on the floor and provides a static support base for all components. Mounted on bearings 4 which are a part of support frame 3, is tilt frame 5 which tilts in respect to support frame 3. Tilt gear motor 9 mounts to support frame 3 and controls the tilting of tilt frame 5 with respect to support frame 3. Mounted on the tilt frame 5 is heater assembly 14 which is fastened semi-permanently to tilt frame 5. Supply piping 11 feeds gas to and from the commutator 13. Supply piping 11 and the exterior of commutator 13 are free to tilt with tilt frame 5. Gear motor 7 is also fastened to tilt frame 5 and provides rotational force for axle 18. Axle 18 rotates inside heater assembly 14. Mounted to rotate with axle 18 are reversing valve 17, filter 15, and the interior portion of commutator 13.

Figure 1A:
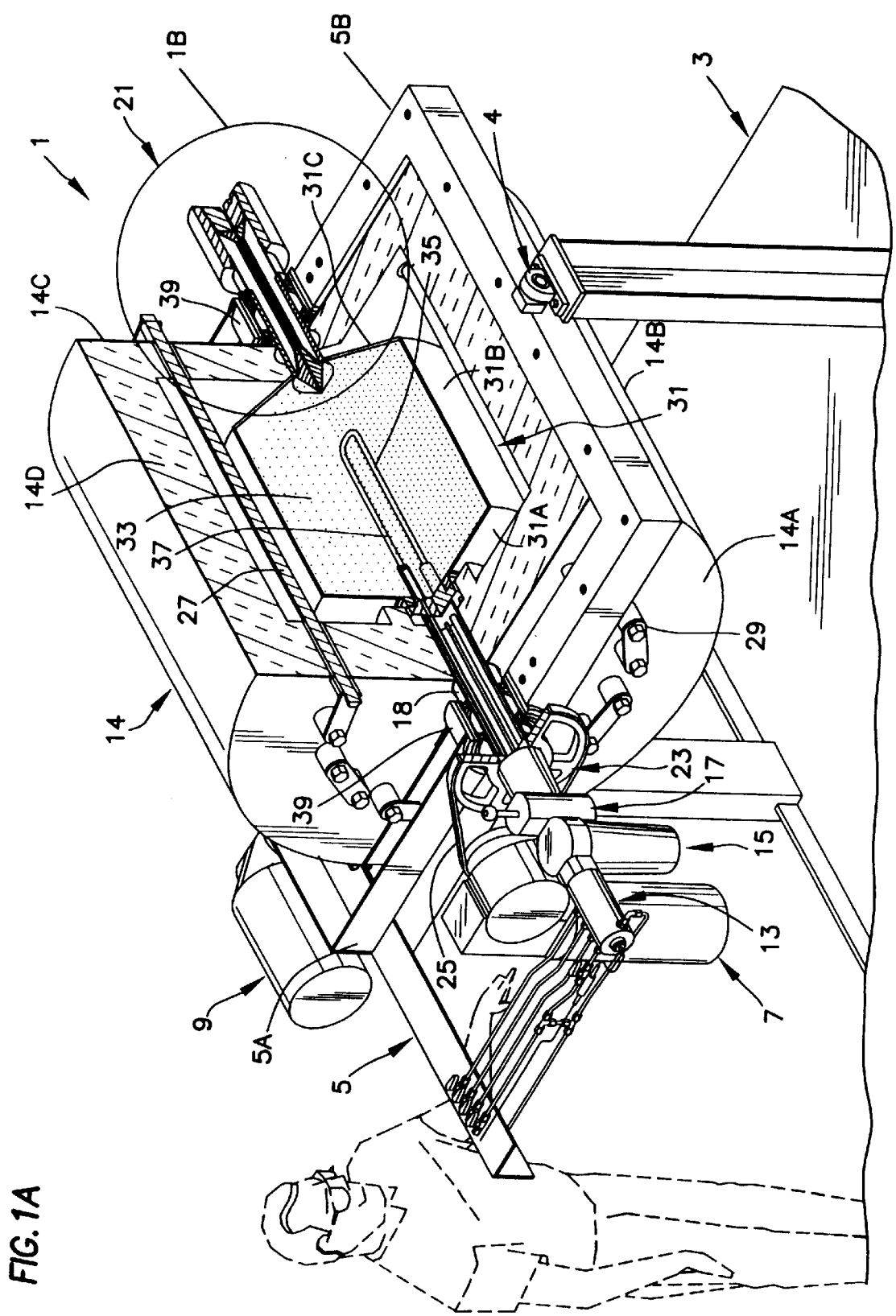
FIG. 1A is a view of the apparatus of FIG. 1 with certain parts cut away to show internal components.

FIG. 1A is an enlarged view of machine 1 and is partially cutaway to show internal components. Drive sheave 23 is mounted to axle 18 and provides force from gear motor 7 through drive belt 25. Heater elements 27 are mounted within heater assembly 14 and connected to each other through connector 29. Connector 29 may also be attached to an exterior electrical supply source not shown. The retort is shown generally as 31 and contains powder 33, cooling coil 35, and filter elements 37. Axle 18 rotates on two sets of bearings indicated generally as 39. Axle 18 is permanently welded to retort 31. Tilt frame 5 comprises upper frame 5A and lower frame 5B.

Figure 1B:
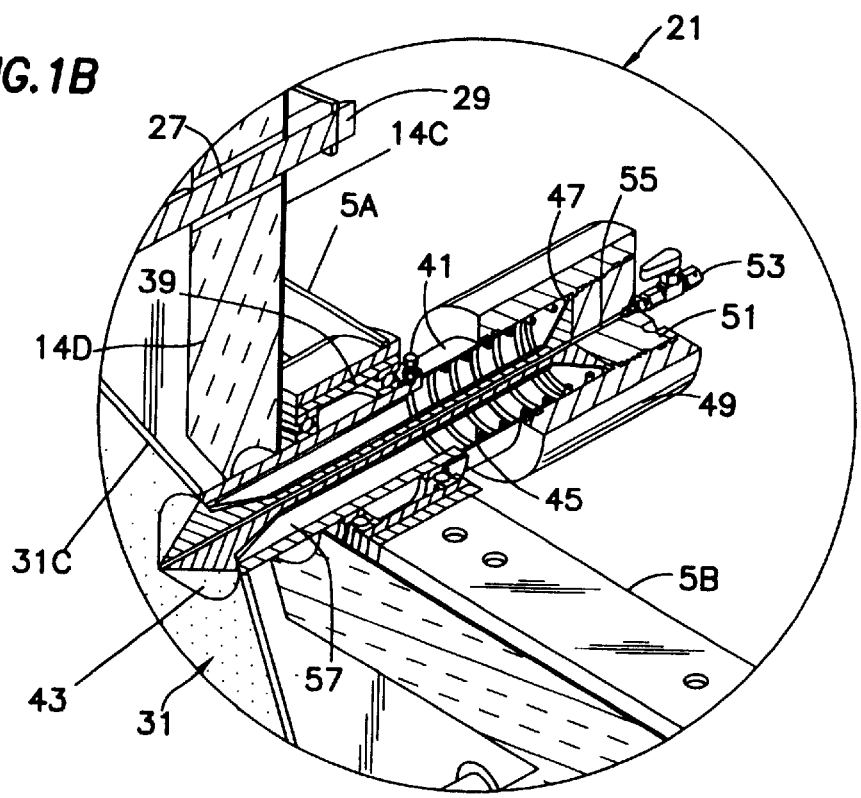
FIG. 1B is an enlarged section of the area indicated as 21 in FIG. 1A.

Retort 31 comprises vertical endwall 31A, cylindrical section 31B and tapered endwall 31C. Heater assembly 14 comprises endwall 14A, cylindrical section 14B, second endwall 14C and interior insulation 14D. FIG. 1B shows a close-up of the section indicated as 21 on FIG. 1A.

In some instances, it may be feasible to have a short puff of gas through filters 37 in a reverse direction, such as an interim spike, perhaps less than a second of reverse flow tending to clear filters 37.

Referring now to FIG. 1B, second axle 41 rotates on bearing set 39 and is welded to endwall 31C. Inside second axle 41 is valve member 43 which reciprocates inside second axle 41 and is biased to close upon endwall 31C by spring 45. Spring 45 bears on enlarged section 47 of valve member 43. Closure 49 is mounted releasably to second axle 41. Closure 49 has a removable plug 51 which in turn connects to valve 53 mounted thereto, which communicates to conduit 55 which extends the length of valve member 43 to offer a small entrance conduit to the interior of retort 31 by opening valve 53. Removable plug 51 with valve 53 may be removed. By pushing in on the enlarged section 47 of valve member 43, spring 45 is compressed to allow the interior chamber 57 within second axle 41 to communicate with the interior of retort 31 to allow powder to be passed into or out of retort 31.

FIGS. 2A, 2B and 2C show machine 1 respectively in positions for receiving powders, normal operations, and unloading powders. Referring to FIG. 2A, exterior vessel 62 comprises gas entrance nozzle 62A, fluidizing plenum 62B, connector 62C, all permanently connected to exterior wall 62D. Powder loaded into exterior vessel 62 is removably attached to an end axle of machine 1 by connection 62C. When tilt frame 5 is tilted approximately 30 degrees as shown, powder flows through connector 62C into the interior of the machine.

In FIG. 2B, the machine has rotated tilt frame 5 to the horizontal position for normal operations with exterior vessel 62 removed from connector 62C. In FIG. 2C, tilt frame 5 has been further rotated. A separate exterior vessel 64 is removably attached to the end axle by connector 62C so that powder exits from machine 1 into exterior vessel 64. Vessels 62 and 64 along with connector 62C do not normally rotate with the end axle 41. However, under some situations, it may be desirable for vessels 62, 64 and connector 62C to rotate with the end axle 41.

In the sequence of events shown in FIGS. 2A, 2B and 2C, powders are loaded into the retort, normally when it is in the position of FIG. 2A. Powders can also be blown into the retort when it is horizontal, as in FIG. 2B, since the retort is generally filled only a little more than half full. Powders are unloaded when the retort is positioned as in FIG. 2C.

Figure 4:
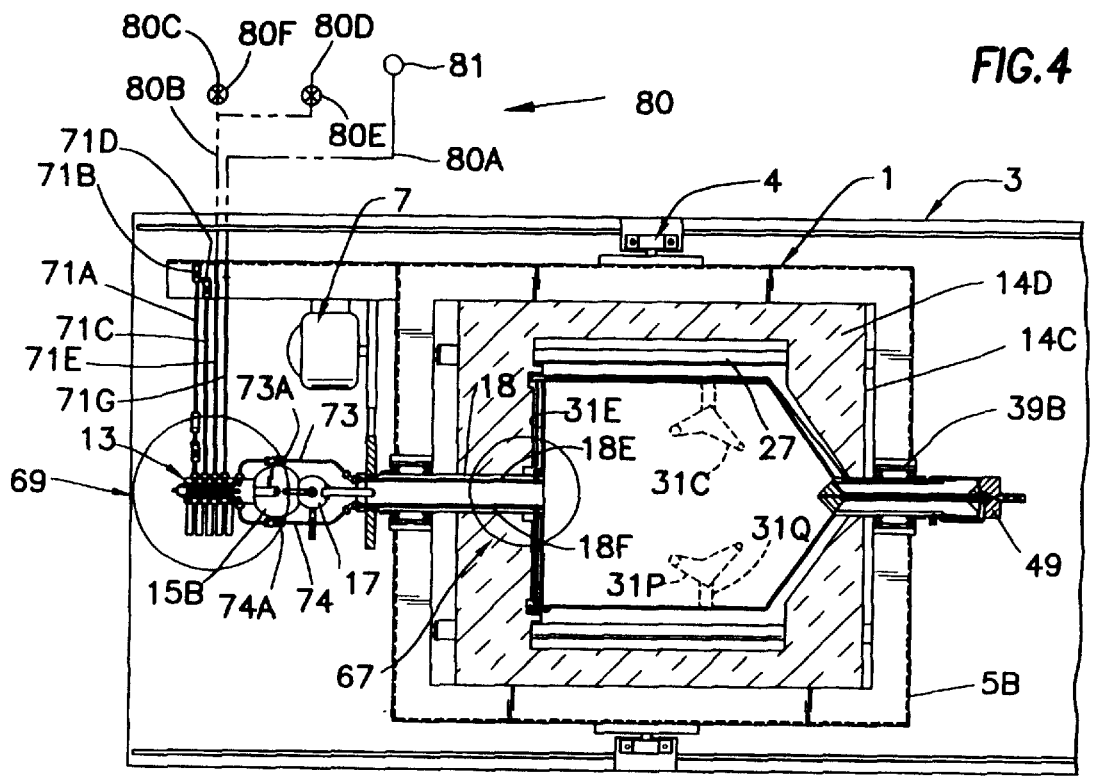
FIG. 4 is an orthographic section at a horizontal plane through the rotating axis of the apparatus.

It is possible to achieve very high quench rates on workpieces which may be permanently mounted within machine 1, as shown in FIG. 4. Machine 1 may be positioned as shown in FIG. 2C so that hot powder, which has previously been used to heat components 31P and 31C may be dumped directly into exterior vessel 64. The hot parts 31P mounted on fixtures 31Q will remain in the machine. Then the machine can be raised to the position shown in FIG. 2A and cold powders may be injected into the machine, from exterior container 62. This will cause a very substantial effect upon solid parts 31P mounted within the machine as shown in FIG. 4.

Although it is normal to cease rotation of the machine when it is rotated into position shown in FIG. 2A and FIG. 2C, it is also possible to make the connection 62C a rotatable connection so that if desired, the retort may continue in rotation during the loading and unloading of powders.

Figure 3:
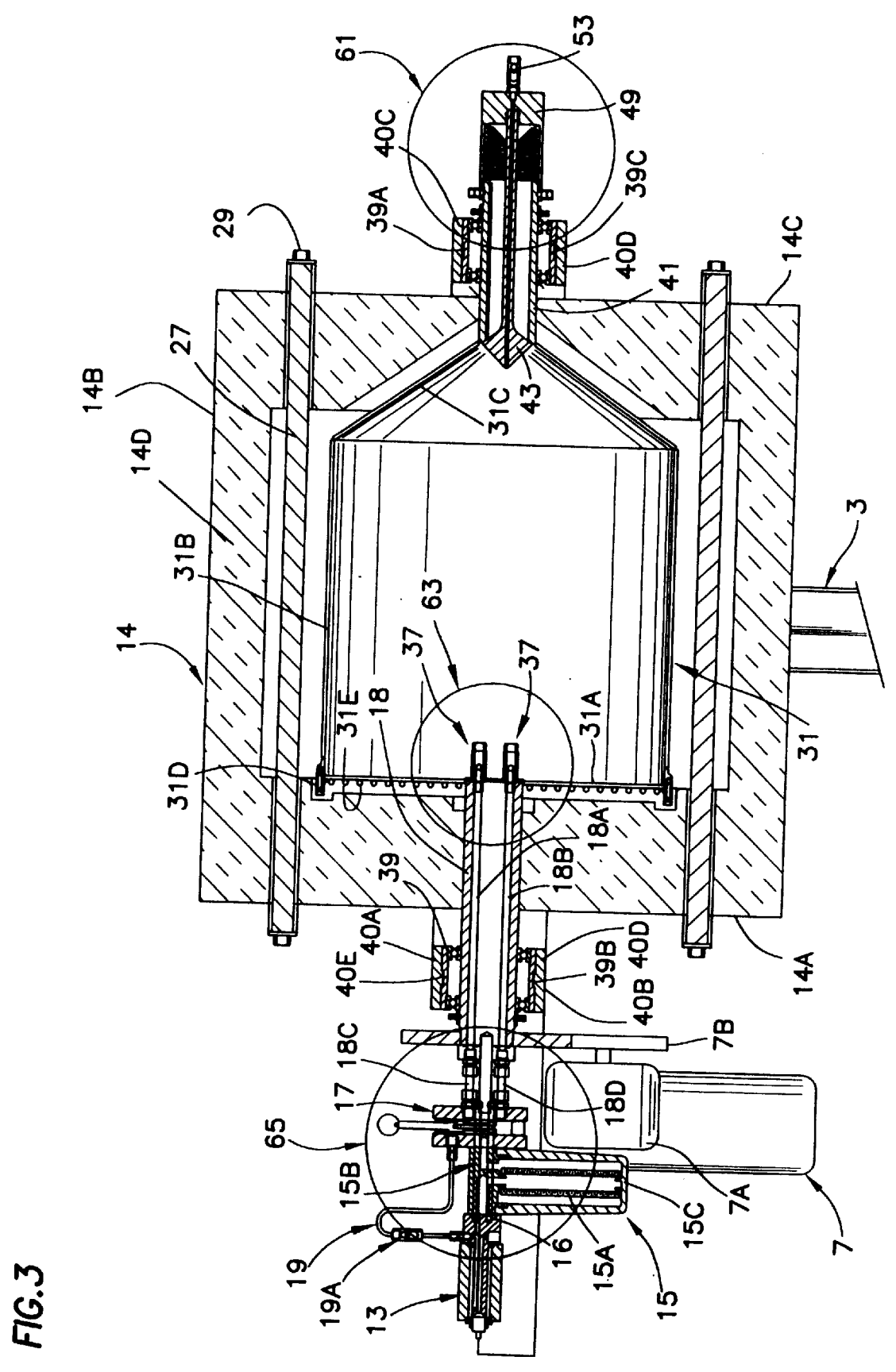

Referring now to FIG. 3, retort 31 can be seen to comprise endwall 31A welded to axle 18. Cylindrical section 31B is bolted to endwall 31A by bolts 31D. Tapered endwall 31C is welded to cylindrical section 31B and also to second axle 41. Also welded to endwall 31A is cooling tube 31E. Within retort 31 are metal filters 37 which connect to conduits 18A and 18B within axle 18. Conduits 18A and 18B connect respectively with removable conduits 18C and 18D which connect with reversing valve 17. Filter 15 comprises filter insert 15A, filter cap 15B and filter bowl 15C. Filter cap 15B and reversing valve 17 are connected to commutator 13 by bolts 16. Gas flow from commutator 13 passes to reversing valve 17 through conduit 19 which contains valve 19A. Retort 31, axle 18 and second axle 41, rest as a unit and are rotated by gear motor 7 through reduction unit 7A and drive sheave 7B in bearing sets 39 and 39A. Bearing sets 39 and 39A are identical having radial slots 39B and 39C. Bearing set 39 is retained by holders 40A and 40B which are welded respectively to tilt frame 5A and 5B. Likewise holders 40C and 40D are respectively welded to tilt frames 5A and 5B. Holders 40A and 40B have inwardly extending ribs 40E which engage slot 39B to hold bearing set 39 from moving longitudinally. Holders 40C and 40D are not equipped with ribs to engage slot 39C and thus bearing set 39A may move longitudinally with respect to holders 40C and 40D to allow for differences in expansion and contraction of retort 31, axle 18 and second axle 41 with respect to tilt frame 5. Circled areas 65, 63 and 61 respectively are shown in detail on FIGS. 5, 7 and 8.

Referring now to FIG. 4, items not appearing in other views are described. Gas and water lines 71A, 71C, 71E and 71G supply gas or water to and from commutator 13. Gas enters through line 71A with valve 71B providing a source of control. Gas is exhausted through line 71C with valve 71D providing control. Cooling water enters through line 71E and is exhausted through line 71G. Water is supplied to line 71E through a piping shown in schematic form generally as 80. Cooling fluids are drawn through the system by vacuum pump 81 through line 80A which connects to line 71G to the commutator 13. Supply of cooling water is by line 80C through valve 80F to line 80B and thence to line 71E. Air can enter the system at line 80D and is controlled by valve 80E. In operation, valve 80F is initially closed so that only air is drawn through line 80D and controlled by valve 80E. This provides air cooling to minimize the shock on the cooling system within the retort. After a period of time, valve 80F may be opened and valve 80E may be closed to introduce water into the cooling system. Cooling fluids exit the retort through line 73 equipped with shut off valve 73A and connect to conduit 18E and axle 18 subsequently connecting to cooling tube 31E described in FIGS. 3 and 4. Heated fluids return from cooling tube 31E through conduit 18F in axle 18 connecting thereafter to conduit 74 which contains block valve 74A and thence flow into commutator 13 and thence exit the commutator 13 as described before. FIG. 4 includes circled areas 69 and 67, which are described later respectively in FIG. 6 and 9.

As indicated by the dotted lines, workpieces 31P may be mounted on fixtures 31Q within retort 31 as shown in FIG. 4. In this case the principal purpose of the fine powder within the retort is to transfer heat uniformly from the walls of retort 31 into workpieces 31P or to allow heat to flow rapidly from parts 31P through the powder and into the retort 31.

Figure 5:
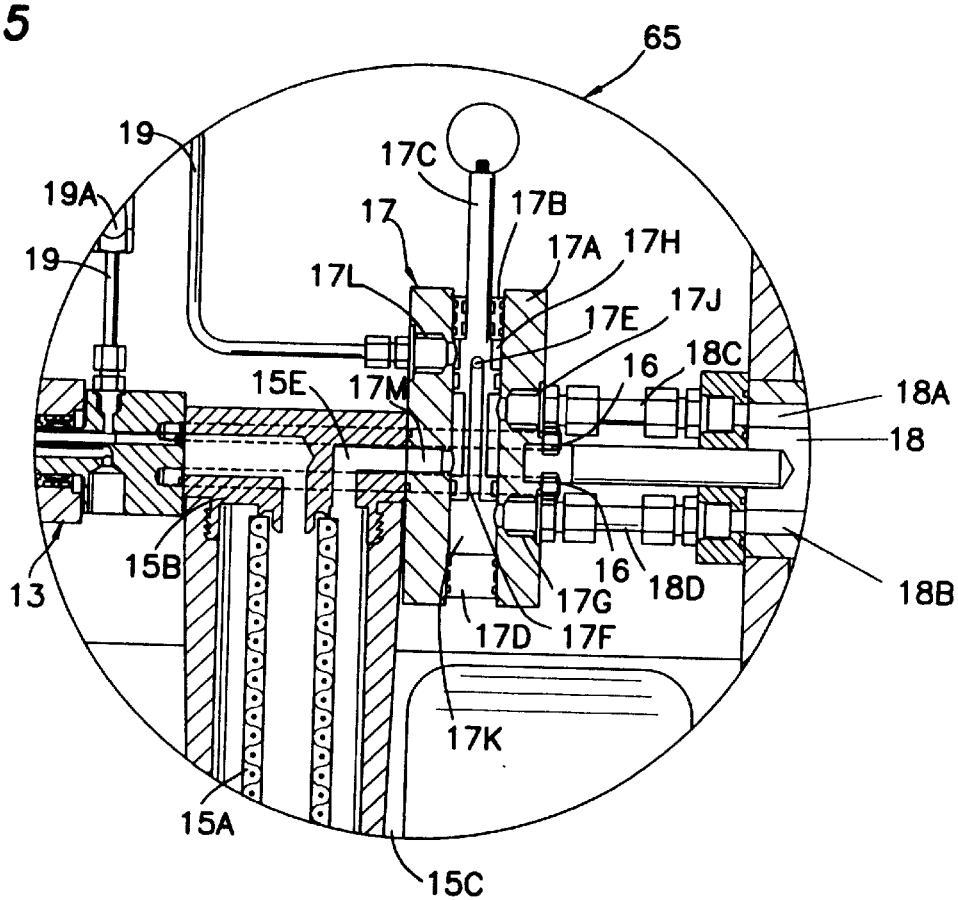
FIG. 5 is an enlarged section of the area indicated as 65 in FIG. 3.

FIG. 5 shows a close up of the area detailed within the circle as 65 in FIG. 3. It shows the details of reversing valve 17. Reversing valve 17 is designed so that gas entering line 19 may be alternately directed to conduits 18A or 18B in axle 18 to provide a reversal of flow through filters 37 shown in FIG. 7. Since filters 37 are in a dusty atmosphere, it is desirable not to have the direction of flow constantly the same, but should be periodically reversed so the filter is flushed of any contaminate that might penetrate it. Incoming gas from line 19 enters reversing valve 17 and alternately is directed to connectors 18C or 18D which connect respectively with conduits 18A and 18B and axle 18. Reversing valve 17 as shown in FIG. 5 comprises piston 17C, bushing 17B, valve body 17A, inlet 17L, ports 17G and 17J, and lower plug 17D. When valve piston 17C is in its upmost position as shown, gas from line 19 passes through inlet 17L into chamber 17H, then through port 17E through conduit 17F into chamber 17K, thence out port 17G through connector 18D into conduit 18B. When piston 17C is lowered to its lower position, gas coming through line 19 enters through inlet 17L into chamber 17H which by the position of piston 17C then allows the gas to flow to port 17J into connector 18C and thence into conduit 18A. Irrespective of the position of piston 17C, gas exhausting from either conduit 18A or 18B passes out port 17M into port 15E of filter cap 15B.

Figure 6:
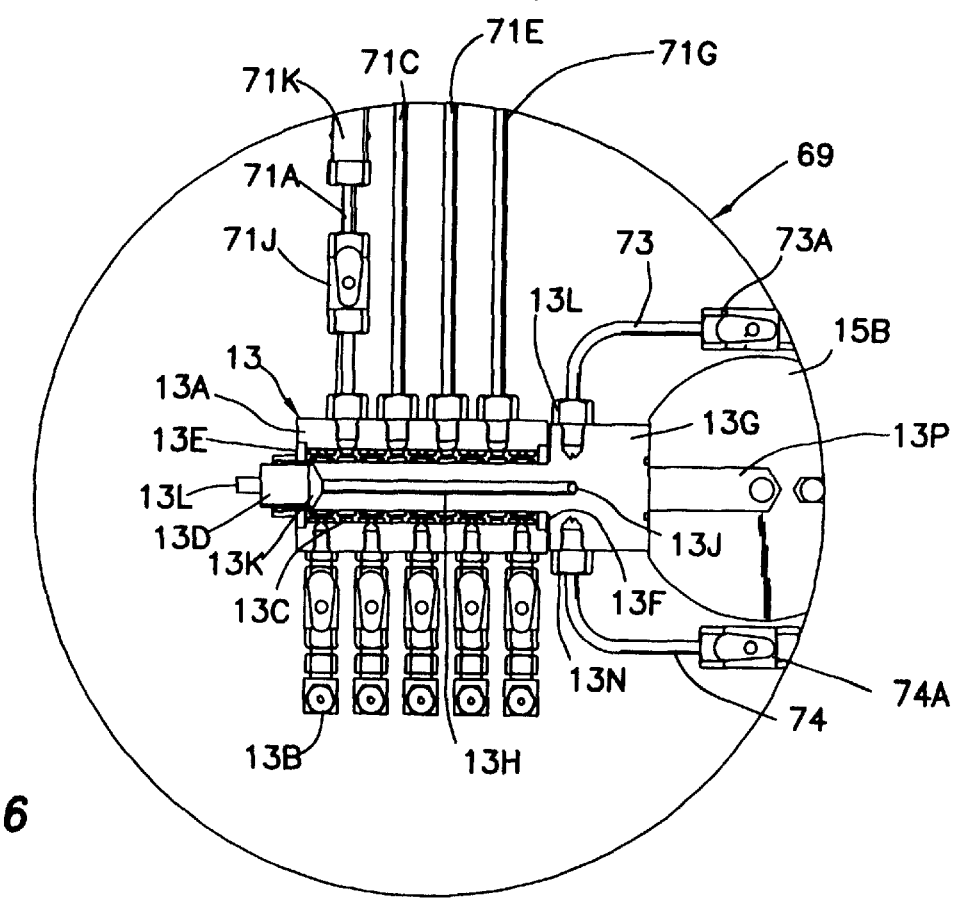
FIG. 6 is an enlarged section of the area indicated as 69 in FIG. 4.

FIG. 6 is the area designated 69 in FIG. 4 and shows details of commutator 13. Commutator 13 is designed to change all incoming gas and electric lines from static positions in relation to tilt frame 5 to rotational movement in relation to tilt frame 5. Commutator 13 comprises housing 13A, rotor 13G, having numerous ports thereto, one being shown as 13H which connects with outlet port 13J. Bearings 13E and 13F allow rotor 13G to rotate in a fixed relationship with housing 13A. Electric commutator 13D is also mounted in receptacle 13K of rotor 13G. Electrical connection 13L connects to electric commutator 13D. Connection 13L is stationery and electric commutator 13D is fixed in cavity 13K in rotor 13G and rotates with rotor 13G. Inlet gas is supplied through line 71A through a shut off valve 71J into ports between two seals 13C, passes into rotor 13G through ports not shown and exits through a connection shown as line 19 in FIG. 5. Exhaust comes out of filter section 15B through port 13P into a port not shown through rotor 13G, thence between seals 13C into line 71C. Inlet cooling fluids enter line 71E which is passed between seals 13C into internal ports not shown and exit at connection 13L through line 73 and valve 73A. Spent cooling water passes through valve 74A through line 74 into connection 13N into rotor 13G through ports not shown and exits between seals 13C into line 71G. A valve and piping manifold indicated as 13B is connected to incoming gas through a line not shown which tees into the incoming line at tee 71K. Valve and piping manifold 13B individually directs gas between seals 13C. If any of the seals 13C should have a leak, the leak would be gas coming from manifold 13B rather than the exterior air. Generally the pressure applied through the manifold 13B is the same as the supply pressure entering the commutator through line 71A. However, by manipulating valve 71J, it is possible to raise the supply of pressure at manifold 13B above that in the commutator 13. In an extreme case, valve 71J may be closed entirely and vacuum be drawn through line 71C. Manifold 13B will pressure seals 13C to assure the seals are pressure activated and if any leak does occur inward leak is preferred gas in manifold 13B rather than atmospheric gas.

Figure 7:
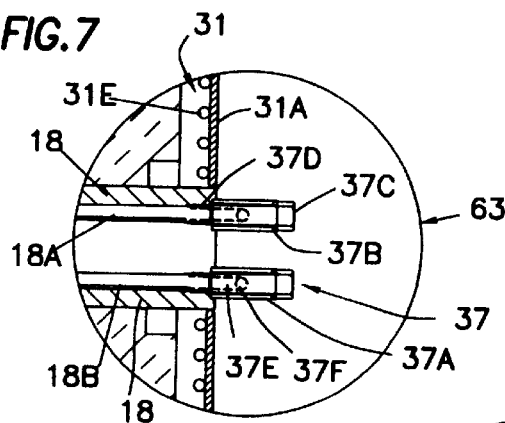
FIG. 7 is an enlarged section of the area indicated as 63 in FIG. 3.

Referring now to FIG. 7, which is an enlarged view of circled area 63 on FIG. 3, shown are the endwall 31A of retort 31 with cooling coils 31E. A portion of axle 18 is shown with internal conduits 18A and 18B. The end of conduits 18A and 18B are filter assembly 37. Each filter assembly 37 consists of permeable metal membrane cylinder 37A and end washer 37B and bolt 37C. Bolt 37C engages in threaded engagement with threads 37D in the end of conduits 18A and 18B. Bolt 37C has a cross hole 37F and a longitudinal hole 37E which allows communication of gas through the permeable membrane 37A, through cross hole 37F, through longitudinal hole 37E and into conduits 18A and 18B.

Figure 8:
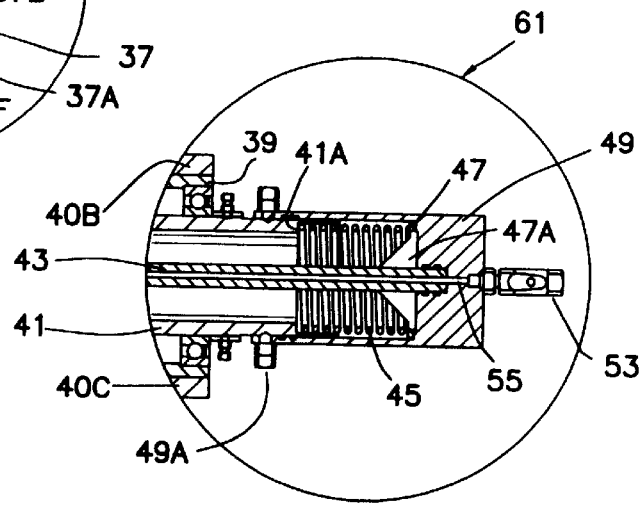
FIG. 8 is an enlarged section of the area indicated as 61 in FIG. 3.

FIG. 8 is the enlargement of the circled area 61 shown on FIG. 3. Second axle 41 is mounted on bearing set 39. Mounted within second axle 41 is valve member 43. Mounted on the end of second axle 41 is closure member 49 which has valve 53 mounted integrally thereto. Valve 53 communicates with a conduit through valve member 43 shown as 55. By opening valve 53 it is possible to gain entrance through end member 49 through valve member 43 into the interior of the retort 31 for purpose of injecting material or taking samples. Spring 45 biases valve member 43 towards the seated position. Spring member 45 seats against surface 41A and second axle 41 and seats against ring 47 which is mounted by ribs 47A to valve member 43.

Figure 8A:
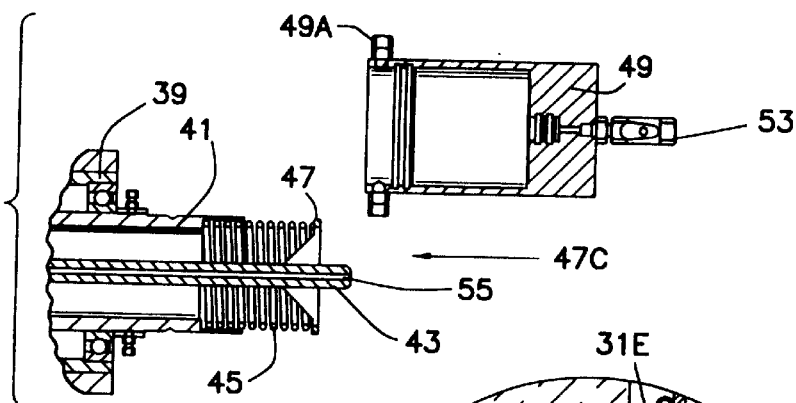
FIG. 8A is an alternate view of the area shown in FIG. 8 in which a component has been removed and set aside for clarity.

In FIG. 8A, end closure 49 along with valve 53 and locking bolts 49A have been removed as would be the case if a separate unloading device were to be attached. By pressing on ring 47 in direction 47C against valve member 43 spring 45 is compressed. Referring back then to FIG. 3 it can be seen that valve member 43 would be raised off its engagement with retort endwall 31C and allow material from the interior of the end of retort 31 to flow by valve member 43 out between ribs 47 and into a suitable receiving device. Material can be loaded into the retort also by pressing on ring 47 in the direction 47C.

Figure 9:
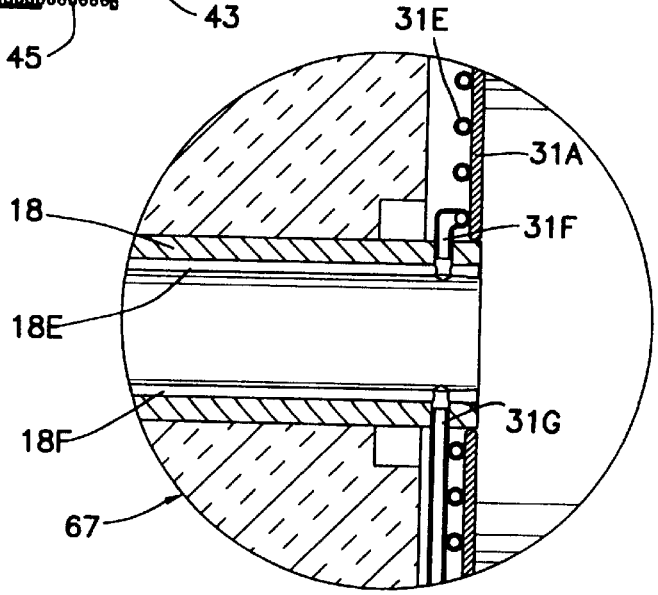
FIG. 9 is an orthographic section of an area shown as 67 in FIG. 4.

FIG. 9 is the enlarged section 67 shown on FIG. 4 . The purpose is to show how liquid enters through the axle and into cooling coils along endwall 31A. The end of axle 18 is shown rotated into a position so that conduits 18E and 18F lie in a cross section view. Cooling fluid enters conduit 18E, passes through connection tube 31F into cooling coil 31E. Fluid is circulated through cooling coil 31E in a spiral fashion. Coil 31E is welded permanently to wall 31A. After the fluid reaches the outermost portion, it returns through 31G into conduit 18F.

Figure 10:
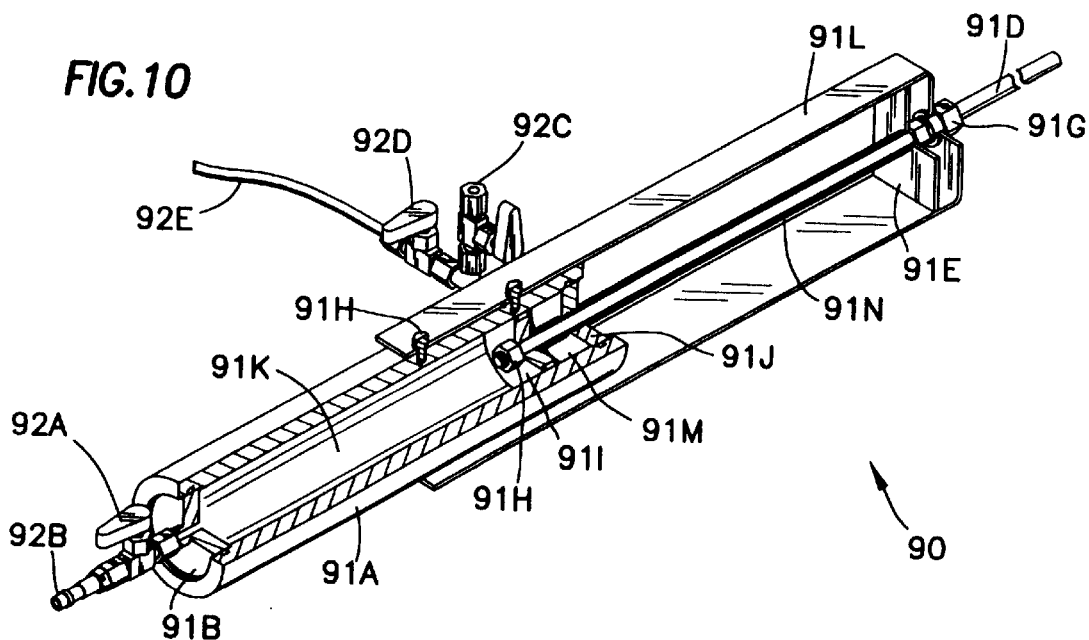
FIG. 10 is an isometric section of a removable injection device for injecting additional particulate material into the retort.

Referring now to FIG. 10, an injection assembly or device 90 is shown to inject solid particulate material or powder into the interior of retort 31. Injector assembly 90 comprises body section 91A having end wall 91B, piston 91I, with chamber 91K therebetween. Solid materials can be placed in chamber 91K. By pushing forward on piston 91I, particulate material can be forced against endwall 91B and thence through valve 92A and connection 92B. Piston 91I is made of a permeable material. Piston 91I is bolted to rod 91D and is fixed on rod 91D through spacer 91N and bolt 91H. Spacer 91J is positioned by anti-rotation member 91E and bolt 91H. Bushing 91G provides means for rod 91D to pass through bushing 91G. Conduit 92E brings supply gas through valve 92D into chamber 91M formed between piston 91I and fixed end bushing 91J. Valve 92C is allowed to bleed off supply gas and thereby control pressure in chamber 91M. Yoke assembly 91L provides a means of holding bushing 91G so that rod 91D may pass therethrough. Anti-rotation assembly 91E is rectangular in shape to fit within the rectangular confines of yoke 91L so that rod 91D will not rotate. This allows one to apply threads to rod 91D if desired to help push it forward against materials in cavity 91K and force material therefrom through valve 92A into conduit 92B and into the machine. In normal operation gas entering conduit 92E into chamber 91M also passes through permeable piston 91I and partially fluidizes material within cavity 91K. This gas pressure therefore applies force to push piston 91I against a material within cavity 91K, but also allows some gas to fluidize that material, and make it more amenable to flow into conduit 92B. In operation, injector assembly 90 would be attached to valve 53 in FIG. 3 so that material could be injected into retort 31. Conduit 92B is designed to allow rotation so that injector 90 can be a static position even though valve 53 and axle 41 were rotating.

Figure 11:
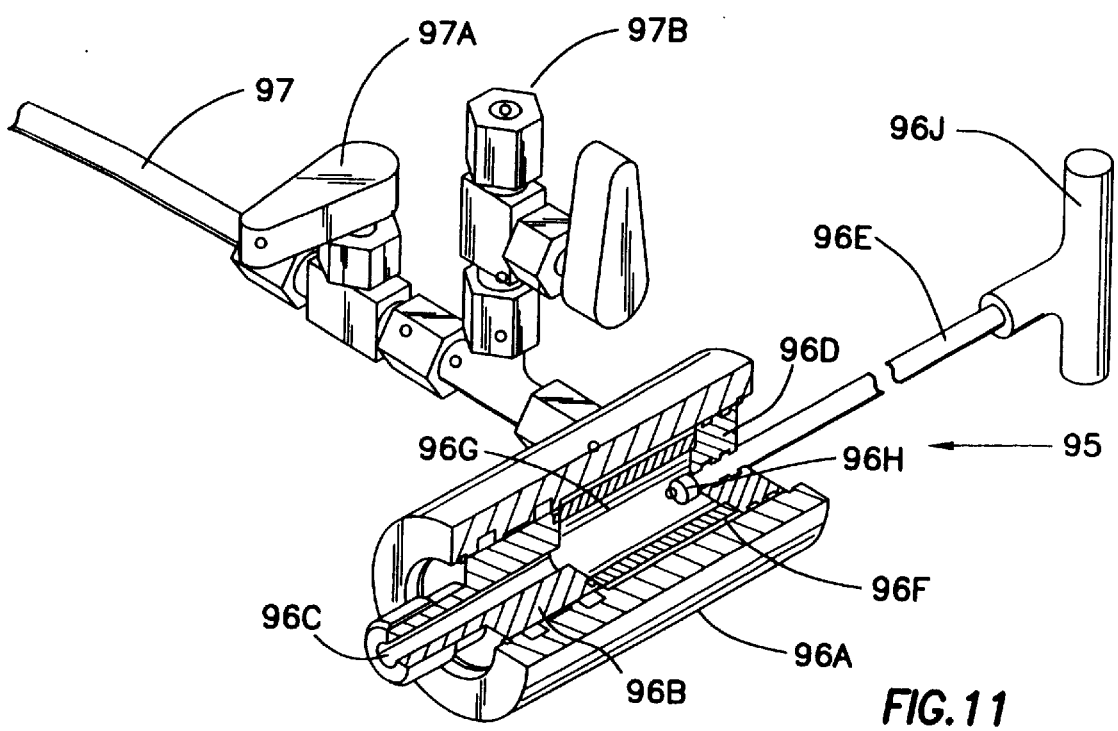
FIG. 11 is an isometric section of a removable sampling device for taking samples from the retort.

Referring now to FIG. 11, a sampling assembly is shown generally as 95. Sampling assembly 95 comprises body 96A, having end bushing 96B and second end bushing 96D, forming a chamber 96G therebetween. Surrounding chamber 96G is permeable sleeve 96F. Operation rod 96E can pass slideably through end bushing 96D through urging of handle 96J. Gas entering port 96C in through bushing 96B into chamber 96G can pass through permeable sleeve 96F into line 97 which is controlled by valve 97A and bypass valve 97B. In operation, the sampling assembly is attached to valve 53 in FIG. 3. When the retort 31 is pressurized, material is forced through conduit 55 and valve 53 as shown in FIG. 8, enters through connection 96C through bushing 96B and into chamber 96G. Gases exiting from retort 31 with solid materials may then pass through permeable membrane 96F into exhaust line 97. By manipulating valves 97A and 97B it is possible to first pressurize the entire assembly to equal that within the retort. It is then possible to use handle 96J to push rod 96E through connection 96C into conduit 55 to clear it of any foreign material. Interior retort 31 may also be pressurized from gas through line 97. Then after rod 96E is returned to the position shown in FIG. 11, gas may be exhausted through valve 97B and material from the interior retort 31 will flow through conduit 55 though valve 53 into sample assembly 95 and collect in chamber 96G.

The operations which can be performed by the apparatus as described herein include: (1) loading the retort; (2) normal operation under desired conditions of pressure, vacuum, and heating or cooling; (3) unloading the retort; (4) obtaining samples from within the retort; (5) reversing of flow of gases through the filters within the retort; (6) assuring uniform gas mixture throughout very large retorts; (7) injecting additional materials into the retort; and (8) quenching objects within the retort by unloading hot powder and reloading cold powder.

Loading

Materials may be injected into the interior of retort 31 by the method indicated in FIG. 2A. Tilt frame 5 with all appurtenances attached thereto is tilted upward about 30 degrees. Endcap 49 is removed per FIG. 8 and container or vessel 62 is attached in its place. Container 62 presses inwardly against rib 47A of valve member 47, depressing spring 45 and creating a gap between valve member 43 and retort endwall 31C whereby material from container 62 flows through the center of second axle 41 into retort 31. To facilitate complete emptying of vessel 62, fluidizing membrane in plenum assembly 62B comprises the lower slope of vessel 62 so that gas may be injected through pipe 62A into plenum 62B through a suitable membrane to fluidize the powder material in vessel 62 so that it flows readily.

Normal operation

FIGS. 1 and 1A show machine 1 in normal operation position. As seen in the cutaway section of FIG. 1A powders 33 partially fills the interior of retort 31. Powders 33 within retort 31 become agitated as retort 31 is rotated on axle 18. Powders 33 in the upper portion of retort 31 will be less dense than those in the lower portion and in any one revolution of retort 31 all of the powders undergo substantial movement. Referring to FIGS. 3, 4, 5, and 6, gas atmosphere is injected through valve 71B through line 71A into commutator 13, then through conduit 19, thence through valve 17, thence through either coupling 18C or 18D depending on the position of piston 17C within valve body 17A, thence through other conduits 18A or 18B in axle 18 and thence through filters 37 and into the interior of the retort 31. Exhaust gases pass from the interior of the retort 31 through filters 37 through the other of conduit 18A or 18B thence through the other of coupling 18C or 18D and thence through valve 17, thence into filter 15, through port 15E then through membrane 15A then into chamber 13P, thence through passages in rotor 13G and thence through conduit line 71C. Gases may then be exhausted to the atmosphere or may pass into a vacuum pump or in some cases may be directed into a chemical deactivation unit. Electrical power is supplied through heater elements 27 through connection 29. The high temperature of heater elements 27 radiates heat to the exterior of retort 31 wherein heat is transferred through the walls of retort 31 into the powders 33 which contact the interior surface of retort 31. Insulation 14D prevents substantial heat loss to the surrounding area. Walls 14A, 14B and 14C contain the insulation 14D and heater elements 27 into a contiguous unit. The heater assembly 14 is split along a horizontal axis with each half bolting to tilt frame 5, as indicated in FIGS. 1 and 1A. Gear motor 7 supplies rotating power through belt drive 25 through driven sheave 23 which is attached to axle 18 and causes it to rotate which in turn rotates retort 31 and second axle 41 and all other parts attached thereto.

Cooling

When it is desired to cool the materials within retort 31, cooling fluids are supplied through line 71E through commutator 13, thence through line 73 through conduit 18E. Two embodiments for cooling are shown. In FIG. 1A a cooling tube 35 is attached to the ends of conduits 18E and 18F and cooling fluid circulates through tube 35 creating a flow of heat from powders 33 through the walls of the tube 35 to fluids within the tube 35. FIGS. 3 through 9 show a different style of cooling unit in which cooling coil 31E is welded to the back of retort wall 31A. As indicated in FIG. 9, cooling fluids from line 18E pass into the cooling coil 31E and spiral outward along the face of retort wall 31A returning through conduit 31G and connecting with conduit 18F which then returns fluid through line 74 into rotor 13G of commutator 13, and thence returns fluid to the external system through line 71G.

Reversing Valve Function

Referring to FIG. 7 it is seen that filters 37 are constantly exposed to the fine powders 33 within retort 31. Gas entering through conduit 18A or 18B passing through one of the filter units 37 tends to force powders away from membrane 37A of filter unit 37, but in the other membrane 37A, powders are drawn into the pores of the membrane 37A. If operations are continued, the membrane 37A through which the gas is returning may eventually become clogged with particles. To avoid this it is desired to reverse the filters 37 from time to time so that the filter first functioning as an gas inlet filter functions as a gas exhaust filter and vice versa. This function is provided by valve 17 shown in detail on FIG. 5. Referring to FIG. 5, gas flow entering line 19 passes through port 17L into chamber 17H. When the unit is in the uppermost position, gas passes from chamber 17H through port 17E through line 17F in piston 17C and thence through line 17G eventually through line 18B into the retort 31. Returning gas exits through line 18A through couplers 18C and is directed to port 17J, thence through the interior of valve body 17A exiting through port 17M into port 15E in filter unit 15. When valve piston 17C is moved downward input gas enters through port 17L into chamber 17H and then passes directly into port 17J entering the retort through line 18A and gas exits through conduit 18B through line 17G. In all cases, the final exhaust port within valve 17 is port 17M and the inlet port is always 17L but by the position of valve piston 17C the gas flowing into the axle will flow alternately through port 17J or port 17G.

Referring to FIG. 7 it is shown that filters 37 are relatively close to each other. If the interior chamber of 31A is very large, there is concern that gas entering one of filters 37 may not mix completely with the interior of the retort and will pass directly out the adjacent filter. To prevent this from happening, valve member 71D shown in FIG. 4 may be operated from full on to full off on a timed basis, with valve 71D being primarily in the off position. Whenever valve 71D is in the off position, gas may enter the retort 31 but will tend to build pressure in the retort 31. Since there is no tendency for the gas to flow directly out the adjacent filter, it will penetrate uniformly through all powders 33 in retort 31. From time to time, when valve 71D is opened to exhaust all the gas from the interior of retort 31A, an event that will take place quite suddenly, especially if a vacuum pump not shown is attached at valve 71D. By operating in this manner it is assured that gas entering through one of filters 37 will thoroughly mix with the interior of a retort of any size before being exhausted through the adjacent filter.

Powder injection

In some operations it is desirable to inject powders from time to time through retort end wall 31A while retort 31 is operating. To facilitate this the injection unit shown in FIG. 10 is attached to valve 53 shown in FIGS. 8 and 8A. Materials to be injected are placed in chamber 91K. Gas pressure is then introduced into line 92E controlled through valve 92D to create pressure in chamber 91M. Gas in this area then passes through the permeable walls of piston 91I to fluidize the particles within chamber 91K. Combination of gas pressure within chamber 91M and physical pushing on rod 91D forces material in chamber 91K to pass through valve 92A through conduit 92B into valve 53 thence through conduit 55 in the interior of valve number 43 and into the interior of retort 31. Valve 92C offers a means of further controlling pressure in chamber 91M and also for releasing gas from chamber 91M when it is desired to retract piston 91I such as to allow more material to be loaded in chamber 91K.

Sampling

From time to time it is also desirable to take a sample from the interior of the retort 31 while the machine is operating. A sampling unit generally shown as 95 in FIG. 11 is used. Connection 96C is attached to valve 53 in a manner similar to that used to attach the injection unit 90. Valves 97A and 97B are manipulated, first to equalize the pressure so that sampling unit 95 may be safely attached, then to reduce the pressure within chamber 96G so that material may flow from the interior of retort 31, through conduit 55 through valve 53 thence through connection 96C into the chamber 96G. Gases from the interior of retort 31 are present with the solid particulate materials. These gases will pass through permeable membrane 96F and thence into conduit 97 or exhausted through valve 97B. Rod 96E is slideably connected to the interior of bushing 96D so that rod 96E may be extended through port 96C through valve 53 and thence through conduit 55 to clear any materials which may be lodged within conduit 55. Rod 96E is long enough to extend to the interior of retort 31.

Unloading

FIG. 2C shows a method for unloading the machine after treatment. Tilt frame 5 and all appurtenances attached thereto are tilted to near vertical position. Prior to tilting, receiving unit 64 is attached in place of end cap 49 shown in FIGS. 8 and 8A. Receiving unit 64 depresses valve member 43 compressing spring 45 thus creating a gap between valve member 43 and sloping wall 31C. When the unit is elevated to the position shown in FIG. 2C, powder material flows from the interior of the retort aided by sloping walls 31C into the interior of container 64. Loading and unloading of large retorts by lifting the container with the machine may not be practical in some cases. But the system of loading can be through flexible connections so that connections remain secure while the load is not directly borne by the retort.

It is also important the retort can be rotated while in any position. Tilting the retort gradually to the vertical position, reaching the vertical position only when the dregs of material are to be unloaded, provides superior unloading of some materials.

Quenching Operations

In some cases it is desired to change the interior temperature of retort 31 with great speed. For instance, if parts are fixtured within retort 31 and the powders are used as a means of heat transfer, the unit may be operated in the position shown in FIG. 2B for a desired period of time while powders are heated to a temperature which may be as high as 1000° C. and is at least about 750° C. An insulated container 64 similar to 62 may then be attached to the unit and the unit depressed to position shown in FIG. 2C and all of the hot powders will exit from retort 31 into container 64C. The solid materials 31P held by fixtures 31Q within retort 31 will still, however, be at the elevated temperature. The unit may then be tilted to the position shown in FIG. 2A and a second container 64 similar to receiving container 62 attached thereto. The second container will contain powders having a temperature less than about 550° C. and may be much less or cooled below 0° C., and these powders will be suddenly injected into retort 31 while retort 31A is rotating. As is shown in FIG. 2A, the effect will be that components that have previously been heated by powders which were taken out are now subject to the cooling effect of very cold powders. The result being a very substantial thermal quench of such said materials, as may be desirable for certain metallurgical reactions. If desired, the amount of powders to be injected may be calculated so as to allow the material to stabilize at a particular temperature which is reached when the heat within the fixtured units is transferred into the powders and an equilibrium temperature is reached.

SIMULTANEOUS INJECTING AND EXHAUSTING

In some operations it is desirable to have a simultaneous injection and exhaustion of materials for a continuous operation of retort 31. Referring to FIG. 12, retort 31 has an end wall 31A and rotates within the heater assembly 14.

An axle 98A secured to retort 31 is mounted for rotation in bearings 98B. A drive gear 98C engages axle 98A in driving relation for rotation of axle 98A and retort 31. A feed tube 98D is mounted within axle 98A and an annulus 98E is formed between axle 98A and feed tube 98D. An end fitting 98F has an outlet 98G for the exhaust of gas or a particulate material from annulus 98E and outlet 98G to a suitable discharge or storage area. Feed tube 98D has a central bore 98H and a screw type auger 98I is mounted within bore 98H to feed material, such as a particulate material, from a suitable supply source into retort 31. Auger 98I includes a center shaft 98K having a helical vane 98L thereon. A helical support 98J having reverse thread supports tube 98D within axle 98A and tends to retain particulate material within retort 31.

Material can be augered into retort 31 and the combination of temperature and vacuum and/or gases mixed with the material cause some reaction with the exhaust gases passing out annulus 98E and outlet 98G. If, for instance, the material is quite heavy but the chemical operations tend to break it down then material as it is made lighter by the combination of heat and/or chemical reaction will pass out annulus 98E with the exhaust vacuum. In such a structure a continuous operation can be obtained where relatively large particles are constantly injected through auger 98I into retort 31 where the temperature and other chemical operations break down the particulate material into smaller particles which are then elutriated out through annulus 98E.

Feed tube 98D and annulus 98E may be utilized to discharge large volumes of gas quickly and efficiently. While a screw auger 98I is shown for feeding material into retort 31, it is understood that materials may be fed within tube 98D in a variety of methods, such as pneumatically or manually, for example. Also, in some instances, annulus 98E could be utilized to supply gas or particulate material to retort 31 with tube 98D utilized to exhaust materials from retort 31.

As an example of the use of the embodiment in FIG. 12, tungsten carbide powder is first placed into the retort 31. Cobalt acetate is then augered into the retort through tube 98D. As soon as the cobalt acetate reaches the retort it flashes into pure cobalt and gaseous by-product and the cobalt is deposited on the tungsten carbide powder. The gaseous acetate is drawn out through annulus 98E between the auger tube 98D and axle 98A. To control the rate of operation, the auger 98I is controlled in speed so that the amount of gas being exhausted at any one time can be handled through annulus 98E and a vacuum pump (not shown) in fluid communication with outlet 98G. The embodiment of FIG. 12 could be used for drying when water is present in new material being augered into retort 31 and where the temperature imparted to said material causes steam to effuse. The steam would be drawn at a rate that would match the auguring in of material so that excessive pressure or temperatures are avoided.

As shown further in the modification shown in FIGS. 13–15 a retort 131A has a cylindrical body 131B and end walls 131C and 131D. End wall 131C is of a frusto-conical shape. Hollow axle 131E is secured to end wall 131D and mounted within bearing 131F for rotation and support. Axle 131E may, if desired, be utilized for the insertion of particulate material within retort 131A or fluidizing by a suitable gas. Insulation body 131G is mounted about retort 131A and supported on a base 131H. Insulating body 131G is formed of a gas impermeable material.

A hollow axle 131I is secured to frusto-conical end wall 131C and mounted in bearing 131J for rotation with retort 131A. Mounted for relative rotation within axle 131I is an auger generally indicated at 131K having a hollow shaft 131L defining a fluid passage 131M. A helical vane 131N is secured about shaft 131L. Particulate material may be fed within retort 131A by helical vane 131N and gas may be exhausted from retort 131A through fluid passage 131M.

In some instances, it may be desirable to inject or exhaust gas through a fluid permeable wall of retort 131A and for this purpose cylindrical wall or body 131B is formed of a fluid permeable metallic material 131P having a predetermined porosity or pore size to restrict the flow of the particulate material within retort 131A. Gas flows into or from the rotating retort through a plenum chamber 131S which is contained by the impermeable insulation 131G. A passage 131R is provided to transmit gas to or from plenum chamber 131G. If desired, end walls 131C and 131D may also be formed of a permeable material. Gas and/or particulate material may be injected within retort 131A through axle 131E or through fluid passage 131M in shaft 131E as desired. Also, retort 131A may be tilted into a vertical position as illustrated in the embodiment of FIGS. 2A, 2B, and 2C.

Examples of Uses of Process

As an example of use of the process, copper oxide particles were loaded into the retort and temperature was increased to approximately 570 Kelvin with an argon atmosphere contained within the retort. When a temperature of 570 K was reached, small amounts of hydrogen were mixed with the argon, increasing the amounts until the exothermic reaction created by hydrogen reacting with the copper oxide to produce pure copper and water was matched by the cooling rate of the retort. When the temperature of 570 K was reached, all heat to the retort was discontinued. The retort was maintained at a constant temperature of 570 K merely by controlling the rate of injection by hydrogen which reacted exothermically with the copper oxide forming water and pure copper. The experiment continued for more than an hour during which time the temperature of the heating devices had been reduced to less than 430 K and the temperature within the retort was maintained at 570 K solely by controlling the introduction of hydrogen to create an exothermic reaction whereby the heat generated by said reaction matched the heat dissipated from the retort. As the heating system cooled, the retort became hotter in respect to the surrounding surface, therefore, the rate of heat dissipation increased. By increasing the amount of hydrogen injection it was still possible to maintain an isothermal condition within the retort.

In another test, nickel and aluminum powders were similarly loaded and heated to 675 K under argon. In this test, the temperature of 675 K was maintained for 30 minutes after which a sample of material was extracted by allowing the retort to pressurize to about 10 psig, then opening a small port into the retort allowing the pressure differential to push out a sample. The temperature was then raised in 50 degree increments holding at each temperature increment for about 30 minutes and taking a sample after each hold period. By the time a temperature of 920 K had been reached, the samples were found to contain nickel and aluminum which had reacted with each other to form a nickel aluminide.

Another example which produced unexpected results was the formation of a thin film of aluminum nitride on small particles of aluminum, ranging in average size from 5 to 20 microns. The aluminum powder was loaded into the retort and heated to 670 K under argon atmosphere. The atmosphere was then changed to ammonia and the temperature held for 4 hours. The temperature was then increased over a period of 4 hours to 870 K and held for an additional 6 hours. Temperature was then increased to 973 K and held for a period of 6 hours. Examination showed only a total nitrogen content of 0.2%. The powder was still free flowing even though held at 973 K, which is about 50 degrees above the melting point of aluminum. Analysis later showed the powder within the thin nitride shell did melt at around 920 K. The powder was heated to above 1270 K and then was cooled again, and the metal again froze when the temperature was cooled below around 910 K. The nitride shell had sufficient strength and continuity to retain within it the molten aluminum and prevent it from coalescing with adjacent powders.

Another example of use is the reduction of water atomized steel powder with carbon. Carbon is frequently used for the partial removal of oxygen from iron powders but seldom is the process complete. The reason lies in the variable presence of oxygen in the iron. If too much carbon were added it would reduce all of the oxygen present and then excess carbon would remain in the iron, possibly carburizing the iron. To avoid this, carbon is generally used for only a partial reduction of the oxygen in water atomized steel powder. Hydrogen is then added to remove the remaining oxygen as water vapor. With the mechanical fluidizing device it is possible to complete the entire reduction with carbon without adding undesirable excess carbon. Because the retort motion constantly fluidizes and homogenizes the mixture within the retort, any carbon added to the metal or mixed with iron in the retort is intimately connected with the oxygen, immediately forming a carbon oxygen compound such as carbon monoxide. The effluent of the retort can be monitored with gas detection equipment.

When the temperature is brought to above approximately 920 K, carbon in the iron reacts with oxygen until all the carbon is depleted. Until the carbon is depleted, the effluent contains a carbon oxygen compound, mixed with the argon. After all of the iron from within carbon in the iron is depleted, the effluent changes to argon, indicating a completion of the reaction. Additional carbon is then injected into the retort and additional oxygen is removed as a carbon oxygen compound. This process is continued until the addition of small amounts of carbon produces no more oxygen in the effluent. At that point it is known that all of the oxygen has been removed from the iron, yet no significant amount of carbon has been added.

As a means of initially proving this theory, a retort was loaded with water atomized steel containing about 2% oxygen in purity. The steel also contained about 0.7 percent carbon. The retort interior was blanketed with argon and heated to 920 K for a period of eight hours. Samples were extracted every thirty minutes. Examination of the samples showed constantly decreasing amounts of oxygen until at the end of the test, the oxygen content was less than half the initial amount. Some additional carbon remained but because the temperature was so low, insignificant amounts of this carbon entered the steel. In the production scheme the effluent would have been monitored to determine when oxygen ceased to be extracted. Instead of all the carbon being premixed with the steel, a certain amount of the carbon would be injected into the mixture, with injection ceasing as soon as the effluent indicated a lack of oxygen being removed.

Another method of removing carbon and oxygen from iron powder utilizes hydrogen. Iron powder was loaded into the retort and heated under argon to 1120 K. Argon was injected into the retort until 1120 K was reached after which hydrogen was injected into the retort. Temperature was maintained for three hours. The carbon in the iron diffused to the surface of the powder and reacted with some of the oxygen to form a carbon-oxygen gaseous effluent which was drawn off the retort. After the carbon was removed the hydrogen reacted with the remaining oxygen to form water which was drawn away by vacuum. The vacuum on the conduit leading gas away from the retort prevents the water from condensing in the exit conduit and commutator.

Another example of the use of the device where the precision control is needed is in the coating of carbon powders with tin. In this operation, substantially all of the carbon powders have a particle size less than about 40 mesh and greater than about 270 mesh were mixed by weight with fine tin powders, having a particle size smaller than 44 microns. Three pounds of tin powder were mixed with every pound of carbon. The tin being very much heavier, presented therefore the smaller volume of the two. Tin melts at a temperature near 500 K with a temperature of approximately 90% of melting or around 450 K being necessary to render the tin in a soft enough state that it will bond to carbon particles to which it came in contact. Powders were placed in the retort and the retort was purged and then filled with argon to create a perfectly inert mixture into which the tin and carbon could react. Temperature was brought slowly to 450 K and held within a temperature of 440 K to 450 K for a period of several hours. The fine tin powders joined to the surface of the larger carbon particles so that each carbon powder was completely coated in a cocoon of tin. It was found by trial and error that temperatures in excess of 480 K resulted in substantial amounts of tin forming into balls rather than attaching to the carbon. Temperatures lower than 400 K did not result in substantial coverage of the carbon with tin.

An example of the benefits of precise temperature control with low vacuum is shown in the removal or "de-hydriding" of reactive metals such as tantalum, zirconium, titanium, hafnium and niobium. In certain manufacturing processes these metals are "hydrided" or combined with hydrogen to make them brittle so they can readily be ground into fine powder, The powder must then be "dehydrided" to remove the hydrogen to restore malleability to the powder. Removal of hydrogen requires heating the powder to high temperature under very high vacuum greater than about 0.10 Torr. The vacuum normally prevents uniform heating because vacuum is such a good insulator. The high temperatures often 1100 K or higher causes powder to agglomerate.

A further precaution against agglomeration is the addition of inert spheres of metal or ceramic into the retort amongst the powders to be treated. These additional microspheres must have a rounded or semi-spherical shape and the smallest microsphere must be larger than the largest workpiece powders to allow subsequent separation. Nitrided stainless steel powders are suitable for use with most powder workpieces such as titanium which has a very high affinity for oxygen. For those workpiece powders such as iron which have less affinity for oxygen, zirconia peening shot has proved satisfactory. Semi-spherical powder in the range of 100 to 500 microns has proved useful. Shot as large as 1500 microns has also been used but thermal transfer is somewhat diminished. Powders are often separated from each other through use of screens having carefully made uniform holes of selected sizes. Most powders have a range of particle sizes. Screens are made in standard sizes such as 60, 80, 100, 150, 200, 270 and 325 sizes which refer to the number of holes in a standard section of screen. The workpiece powder must be measured such as by screening to determine the largest particle size. The additional microspheres must then be selected so that the smallest particle therein will not pass through a screen at least one size larger than that which captures the largest particle in the workpiece powder.

By placing the powders in a rotatable retort and fluidizing the powder while heating it and drawing a vacuum, the tendency to agglomerate is minimized and the exacting temperature prevents hot spots or temperature excursions which would otherwise increase the agglomerating tendency.

Cleaning of Workpieces

In yet another process embodiment, solid workpieces which are contaminated with volatile material, such as cutting oils, can be positioned in the retort along with fine powders capable of being fluidized. The volatile material emits a vapor at a predetermined low pressure. By drawing a vacuum on the retort and heating the retort to a selected temperature, the volatile material can be removed from the workpieces and be drawn out of the retort by a suitable vacuum force. During rotation of the retort, the fine powders contacting the solid workpieces aid in scrubbing and removing encrustations from the solid workpieces for cleaning of the workpieces.

While the process has been described for metallic powders or particulate materials, it is to be understood that the process of this invention may be utilized with non-metallic powders, such as coating a kaolin workpiece with zirconium oxide, coating a ferrous alloy workpiece with silicon carbide, or coating a nickel alloy workpiece with aluminum oxide, for example.

While preferred embodiments of the present invention have been illustrated in detail, it is apparent that modifications and adaptations of the preferred embodiments will occur to those skilled in the art. However, it is to be expressly understood that such modifications and adaptations are in the spirit and scope of the present invention as set forth in the following claims.

What is claimed is:

1. In a substantially horizontally disposed enclosed retort mounted on an axle for rotation about a generally horizontal axis and containing a particulate material for fluidization, the retort having a cylindrical body and a pair of opposed end walls on opposed ends of said body to enclose said retort, the improvement comprising:
    an inlet passage for particulate material extending through an axle for injecting of particulate material within the retort;
    a gas inlet passage extending through said axle for injection of gas within the retort to fluidize the particulate material within the retort; and
    at least a portion of said cylindrical body being fluid permeable to permit the exhaust of gas through said cylindrical body.

2. In a retort as defined in claim 1;
    means to tilt said retort to an angular relation relative to said generally horizontal axis.

3. In a retort as defined in claim 1 wherein at least one of said opposed end walls is fluid permeable to permit the exhaust of gas from said retort.

4. In a retort as set forth in claim 1;
    an insulating body extending about said retort being formed of a gas impermeable material, and a plenum chamber between said retort and insulating body.

5. In a retort as set forth in claim 1;
    an insulating body extending about said retort being formed of a gas impermeable material; and
    a gas opening in said insulating body to permit the of gas through said opening.

6. A processing system comprising:
    a substantially horizontally disposed enclosed retort mounted on an axle for rotation about a generally horizontal axis and containing particulate material;
    means to rotate said retort at a rate that mechanically fluidizes said particulate material with gas within said retort; and
    an auger mounted concentrically within said axle for feeding the particulate material within said retort and defining an annulus between said auger and said axle for fluid flow into and out of said retort.

7. A process system as set forth in claim 6 wherein said auger comprises a shaft and a helical vane mounted on said shaft forming a screw for moving said particulate material along said axle for injection within said retort.

8. A processing system as set forth in claim 6 wherein said shaft is hollow and provides a fluid passage for gas into said retort.

9. A processing system as set forth in claim 8 wherein said hollow shaft forms a fluid passage for the exhaust of gas from said retort.

10. A processing system as set forth in claim 8 wherein said hollow shaft forms a passage for the injection of particulate material within said retort.

11. A processing system comprising:
    a substantially horizontally disposed enclosed retort mounted on an axle for rotation about a generally horizontal axis and containing particulate material;
    means to rotate said retort at a rate that mechanically fluidizes said particulate material with gas within said retort;

an auger mounted within said axle for feeding the particulate material within said retort;

said enclosed retort comprising an enclosed body defining a cylindrical body portion and a pair of end walls closing said cylindrical body portion; and at least a portion of said enclosed body is formed of a gas permeable material to permit the exhaust of gas from said retort.

12. A processing system as set forth in claim 11 wherein said cylindrical body portion has said gas permeable material therein for the exhaust of gas from said retort.

13. A processing system as set forth in claim 11 wherein at least one of said end walls has said gas permeable material therein for the exhaust of gas from said retort.

14. A processing system as set forth in claim 6 wherein said auger has an outer tube spaced from said axle and defines an annular chamber between said outer tube and said axle, said annular chamber forming a passage for the injection of gas into said retort.

15. In a processing system including an enclosed retort mounted about an axle for rotation and having walls containing a particulate material which is fluidized upon rotation of said retort; a process for the injection of particulate material within the retort comprising:

providing an auger within said axle;

injecting particulate material within said retort through said auger;

providing at least a portion of the walls of the retort with a permeable material, and exhausting gas from said retort through said permeable material.

16. In the processing system as defined in claim 15 including:

providing said auger with a hollow shaft; and exhausting gas from said retort through said hollow shaft.

17. In the processing system as defined in claim 15 including:

providing an annular chamber between said auger and said axle; and exhausting gas from said retort through said annular chamber.

18. In the processing system as defined in claim 15 including:

providing an annular chamber between said auger and said axle; and exhausting particulate material from said retort through said annular chamber.

* * * * *

UNITED STATES PATENT AND TRADEMARK OFFICE
CERTIFICATE OF CORRECTION

PATENT NO.    : 6,251,337 B1
DATED         : June 26, 2001
INVENTOR(S)   : John E. Kane It is certified that error appears in the above-identified patent and that said Letters Patent is hereby corrected as shown below:

Column 19,
Line 18, delete "injection of gas into" and insert therefor -- exhaust of gas from --.

Signed and Sealed this

Fifth Day of March, 2002

*Attest:*

JAMES E. ROGAN
*Director of the United States Patent and Trademark Office*

*Attesting Officer*